United States Patent
Tapily

(10) Patent No.: US 11,658,066 B2
(45) Date of Patent: May 23, 2023

(54) METHOD FOR REDUCING LATERAL FILM FORMATION IN AREA SELECTIVE DEPOSITION

(71) Applicant: Tokyo Electron Limited, Tokyo (JP)

(72) Inventor: Kandabara N Tapily, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/319,207

(22) Filed: May 13, 2021

(65) Prior Publication Data

US 2021/0398849 A1 Dec. 23, 2021

Related U.S. Application Data

(60) Provisional application No. 63/040,488, filed on Jun. 17, 2020.

(51) Int. Cl.
*H01L 21/768* (2006.01)

(52) U.S. Cl.
CPC .. *H01L 21/76879* (2013.01); *H01L 21/76843* (2013.01)

(58) Field of Classification Search
CPC ......... H01L 21/76879; H01L 21/76843; H01L 21/76829; H01L 21/76883
See application file for complete search history.

(56) References Cited

U.S. PATENT DOCUMENTS

| | | | |
|---|---|---|---|
| 2005/0093162 A1 | 5/2005 | Gracias | |
| 2006/0281298 A1* | 12/2006 | Noguchi | H01L 21/76834 438/622 |
| 2007/0284746 A1 | 12/2007 | Lopatin et al. | |
| 2014/0199497 A1 | 7/2014 | Spurlin et al. | |
| 2017/0256402 A1 | 9/2017 | Kaufman-Osborn et al. | |
| 2018/0076027 A1* | 3/2018 | Tapily | H01L 21/3105 |
| 2018/0233350 A1 | 8/2018 | Tois et al. | |

OTHER PUBLICATIONS

Korean Intellectual Property Office, The International Search Report and Written Opinion for International Application No. PCT/US2021/031943, dated Aug. 31, 2021, 8 pages.

\* cited by examiner

*Primary Examiner* — Julia Slutsker

(57) ABSTRACT

A substrate processing method includes providing a substrate containing a first film, a second film, and a third film, forming a first blocking layer on the first film, forming a second blocking layer on the second film, where the second blocking layer is different from the first blocking layer, and selectively forming a material film on the third film by vapor deposition. In one example, the first film, second film, and the third film are selected from the group consisting of a metal film, a metal-containing liner, and a dielectric film.

20 Claims, 5 Drawing Sheets

METHOD FOR REDUCING LATERAL FILM FORMATION IN AREA SELECTIVE DEPOSITION

CROSS REFERENCE TO RELATED PATENTS AND APPLICATIONS

This application claims priority to and the benefit of the filing date of U.S. Provisional Patent Application No. 63/040,488, filed Jun. 17, 2020, which application is incorporated herein by reference in its entirety.

FIELD OF THE INVENTION

The present invention relates to semiconductor processing and semiconductor devices, and more particularly, to methods for area selective film deposition that reduces lateral film formation.

BACKGROUND OF THE INVENTION

As device size is getting smaller, the complexity in semiconductor device manufacturing is increasing. The cost to produce the semiconductor devices is also increasing and cost effective solutions and innovations are needed. As smaller transistors are manufactured, the critical dimension (CD) or resolution of patterned features is becoming more challenging to produce. Selective deposition of thin films is a key step in patterning in highly scaled technology nodes. New deposition methods are required that provide selective film formation on different material surfaces.

SUMMARY OF THE INVENTION

Embodiments of the invention provide methods for selective film deposition that reduces lateral film formation by using a blocking layer and an etching process.

According to one embodiment, a substrate processing method includes providing a substrate containing a metal film, a metal-containing liner surrounding the metal film, and a dielectric film surrounding the metal-containing liner, forming a blocking layer on the metal film, depositing a material film on the dielectric film and on the metal-containing liner, and removing the material film from the metal-containing liner to selectively form the material film on the dielectric film. The depositing also deposit material film nuclei on the metal film, and the removing etches the material film nuclei from the metal film.

BRIEF DESCRIPTION OF THE DRAWINGS

A more complete appreciation of embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Figure 1:
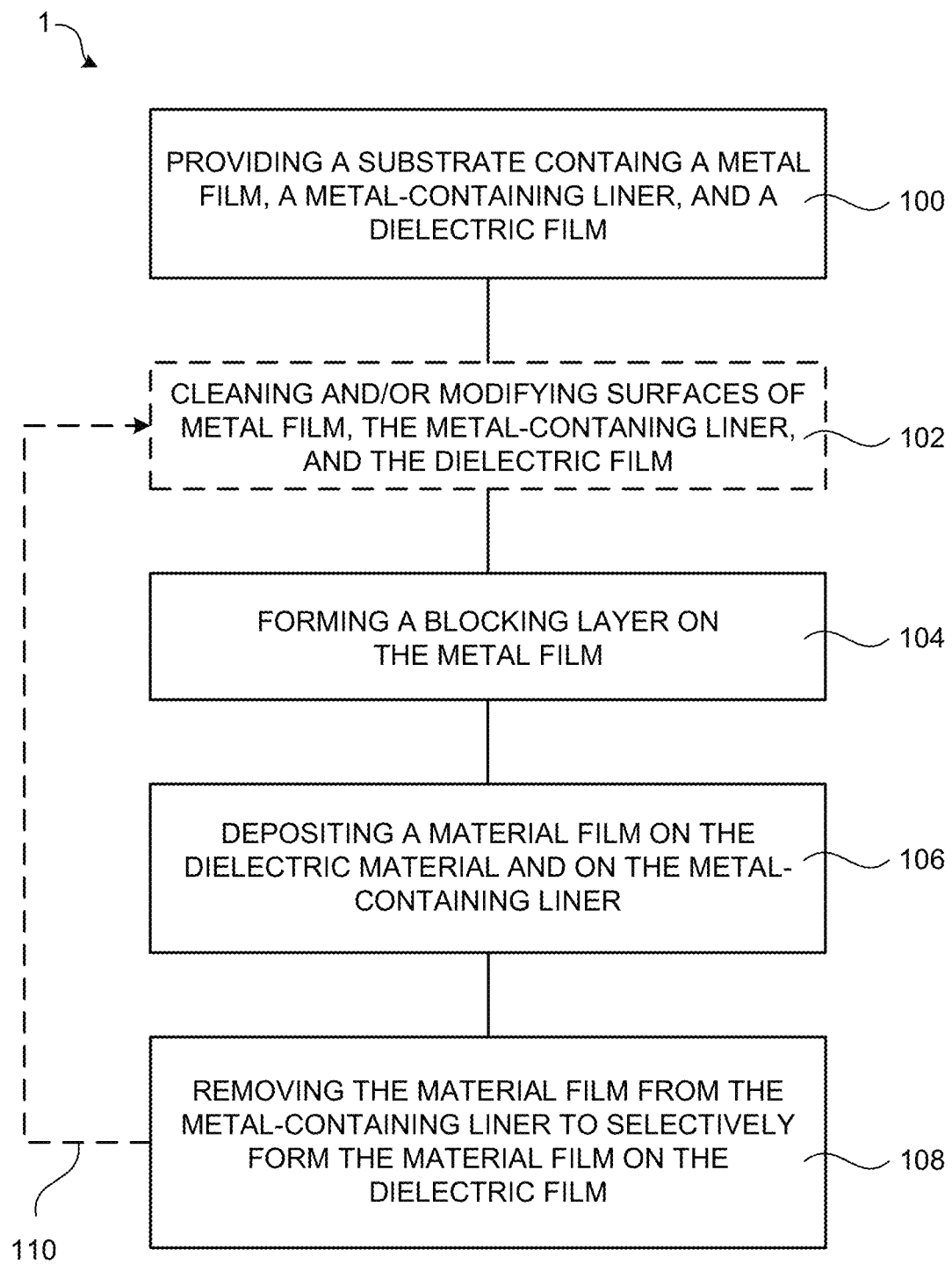
FIG. 1 shows a process flow diagram for a method of selectively forming a film on a substrate according to an embodiment of the invention.

Embodiments of the invention provide methods for reducing lateral film formation in area selective deposition. Embodiments of the invention may be applied to surface sensitive deposition processes such as atomic layer deposition (ALD), chemical vapor deposition (CVD), and spin-on deposition. The area selective deposition provides a reduced number of processing steps compared to conventional lithography and etching process and can provide an improved margin for line-to-line breakdown and electrical leakage performance in the semiconductor device.

Referring now to FIGS. 1 and 2A-2D, the process flow diagram 1 includes, in 100, providing substrate 2 containing a metal film 204 having a surface 204A, a metal-containing liner 202 having a surface 202A, and a dielectric film 200 having a surface 204A. This film structure is commonly found in integrated circuits where the metal-containing liner forms a diffusion barrier, a deposition seed layer, or both, between the metal film 400 and the dielectric film 404. The metal film 204 can include a pure or a substantially pure low-resistivity metal found in metal interconnects metal, for example Cu, Al, Ta, Ti, W, Ru, Co, Ni, or Mo.

In some examples, the metal film 400 can include, such as Cu, Ru, Co, or Ir.

The dielectric film can, for example, contain $SiO_2$, a low-k material, or a high-k material. In one example, the dielectric film does not contain a metal element. The metal-containing liner can, for example, contain a metal compound such as a metal nitride (e.g., TiN or TaN) or a metal that includes Co or Ru. In one example, the metal-containing liner can include a laminate containing metal-compound layer and a metal layer (e.g., TaN/Ta, TaN/Co, or TaN/Ir). In some examples, the dielectric film includes $SiO_2$ or a low-k material, the metal-containing liner includes a laminate containing TaN/Ta, TaN/Co, or TaN/Ir, and the metal includes Cu. In another example, the dielectric film includes $SiO_2$ or a low-k material, the metal-containing liner includes TaN, and the metal includes Ru.

In 102, the surfaces 100A, 102A, and 104A are optionally cleaned, modified, or both, in preparation for area selective deposition. In the example in FIG. 2A, the incoming planarized substrate 2 has the surfaces 200A, 202A, and 204A in the same horizontal plane. However, in other examples, one or more of the surfaces 200A, 202A, and 204A may be offset vertically. The planarization process can include a chemical mechanical polishing (CMP) process that uses a polishing pad and a chemical slurry. The CMP process can leave polishing residue and oxidized material on the planarized substrate 1, and a surface cleaning process may be used for removing those contaminants. The surface cleaning process can also provide the desired surface termination for further processing or a separate surface modification process may be performed to achieve the desired surface termination. The cleaning process can, for example, include a wet cleaning that includes exposing the substrate 2 to a citric acid solution or an acetic acid solution. In another example, the cleaning process can include exposing the substrate 2 to a plasma-excited cleaning gas containing $H_2$ gas.

In 104, the method includes forming a blocking layer 201 on the metal film 200. The blocking layer 201 can physically prevent or reduce subsequent deposition of a material film on the metal film 200. According to one embodiment, the blocking layer 201 includes a self-assembled monolayer (SAM) that is selectively formed on the metal film 204 relative to the metal-containing liner 202 and the dielectric film 200. The blocking layer 201 may be formed by exposing the substrate 2 to a reactant gas that contains a molecule that is capable of selectively forming the SAM. SAMs are molecular assemblies that are spontaneously formed on substrate surfaces by adsorption and are organized into more or less large ordered domains. SAMs can include a molecule that possesses a head group, a tail group, and a functional end group. SAMs are created by the chemisorption of head groups onto the substrate surface from the vapor phase at room temperature or above room temperature, followed by a slow organization of the tail groups. Initially, at small molecular density on the surface, adsorbate molecules form either a disordered mass of molecules or form an ordered two-dimensional "lying down phase", and at higher molecular coverage, over a period of minutes to hours, begin to form three-dimensional crystalline or semicrystalline structures on the substrate surface. The head groups assemble together on the substrate, while the tail groups assemble far from the substrate.

The head group of the molecule forming the SAM may be selected in view of the ability of the molecule to chemically bond to the different chemical species (e.on different surfaces. Some examples of molecules that can form a SAM on a metal film contain a head group that includes a thiol or a carboxylate. Some examples of thiols include 1-octadecylthiol $(CH_3(CH_2)_{17}SH)$, 1-dodecylthiol $(CH_3(CH_2)_{17}SH)$, and perfluorodecanethiol $(CF_3(CF_2)_7CH_2CH_2SH)$. According to one embodiment of the invention, the molecule forming the SAM can include a fluorinated alkyl thiol, for example perfluorodecanethiol. Many fluorinated alkyl thiols contain a thiol (—SH) head group, and a $CF_x$-containing tail group and functional end group.

Referring back to FIG. 2A, the surface 204A of the metal film 204 may be at least substantially free of oxygen following the cleaning process and therefore a SAM blocking layer 201 can easily form on the metal film 204. In contrast, the surface 202A of the metal-containing liner 202 may be oxidized (e.g., $TaNO_x$ or $TaO_x$) following the cleaning process and therefore the SAM blocking layer 201 is prevented from forming on the metal-containing liner 202. Similarly, the dielectric film 200 can include oxygen-containing species, for example a $SiO_2$ dielectric, thereby preventing the SAM blocking layer 201 from forming on the dielectric film 200.

Figure 2A:
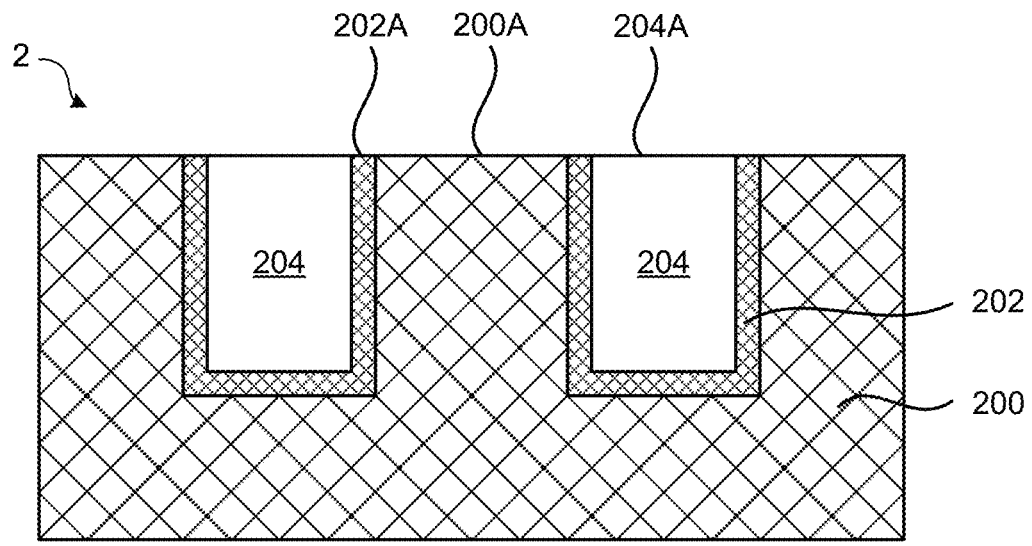
FIGS. 2A-2D show schematic cross-sectional views of a method of selectively forming a film on a substrate according to an embodiment of the invention.
Figure 2B:
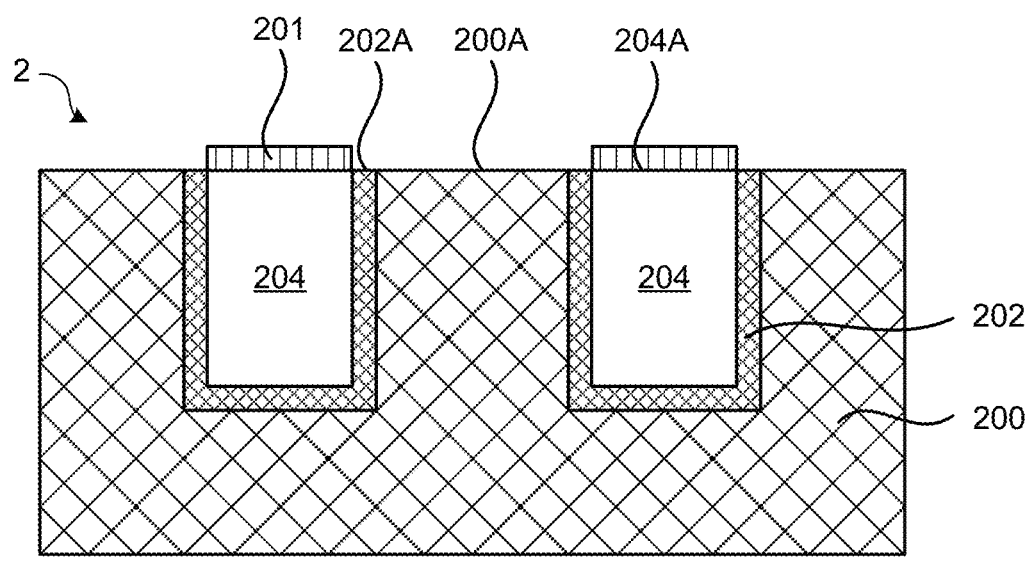
Figure 2C:
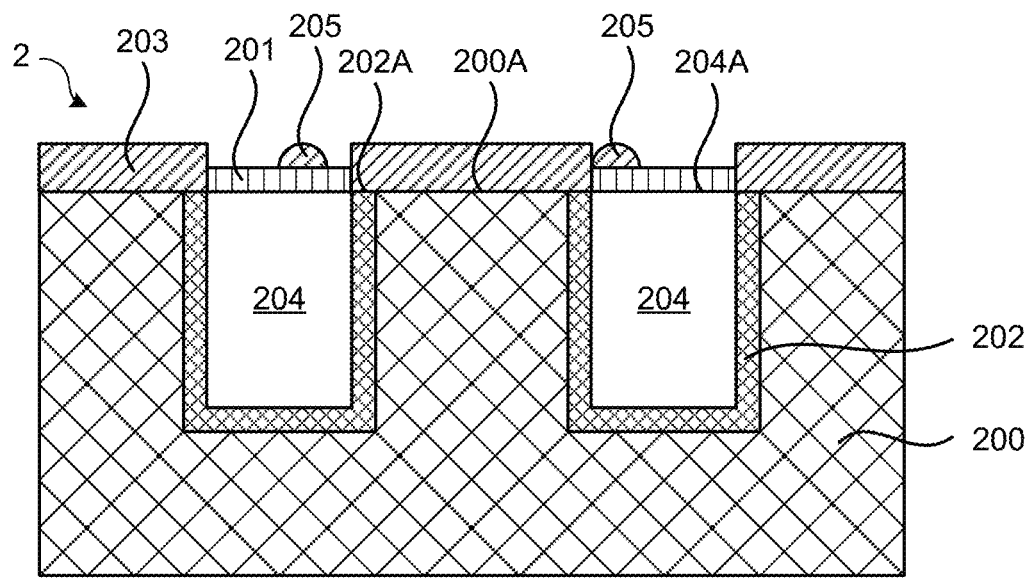
Figure 2D:
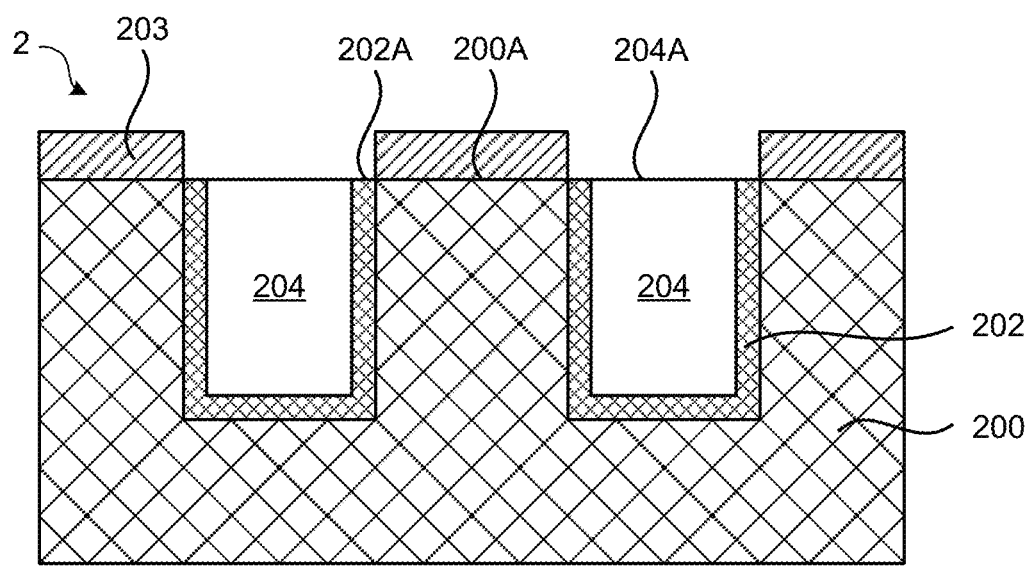

In 106, the method includes depositing a material film 203 on the dielectric film 200 and on the metal-containing liner 202, but deposition of the materials film 205 on the metal film 204 is substantially blocked by the blocking layer 201. However, as depicted in FIG. 2C, material film nuclei 206 may deposit on the blocking layer 204 due to limited deposition selectivity.

In some examples, the material film 203 and the material film nuclei 206 can contain $SiO_2$, a low-k material (e.g., SiCOH), or a high-k material (e.g., a metal oxide). In one example, $SiO_2$ may be deposited by sequentially exposing the substrate 2 to a metal-containing catalyst (e.g., $Al(CH_3)_3$ and a silanol gas. The exposure to the silanol gas can be performed in the absence of any oxidizing and hydrolyzing agent, at a substrate temperature of approximately 150° C., or less. For example, the silanol gas may be selected from the group consisting of tris(tert-pentoxy) silanol, tris(tert-butoxy) silanol, and bis(tert-butoxy)(isopropoxy) silanol. In some examples, the metal oxide can contain $HfO_2$, $ZrO_2$, or $Al_2O_3$. The metal oxide can, for example, be deposited by ALD or plasma-enhanced ALD (PEALD). For example, the metal oxide may be deposited by ALD using alternating exposures of a metal-containing precursor and an oxidizer (e.g., $H_2O$, $H_2O_2$, plasma-excited $O_2$ or $O_3$).

In 108, the method further includes removing the material film 203 from the metal-containing liner by etching to selectively form the material film 203 on the dielectric film 200. Further, the etching can remove the material film nuclei 206 and the blocking layer 201 from metal film 204. In some examples, the etching may be performed by exposing the substrate 2 to an etching gas containing $Al(CH_3)$, $BCl_3$, $TiCl_4$, or $SiCl_4$. In one example, the etching process may include an atomic layer etching (ALE) process.

In one example, it is believed that the blocking layer 201 can be used to modify the material film 203 on the metal-containing liner 202. Subsequent introduction of an etching gas can enable selective removal of the material film 203 from the metal-containing liner 202 through ligand exchange etching, relative to the material film 203 on the dielectric film 200. An example of the ligand exchange etching can include selective fluorination or chlorination of material film 203 on the metal-containing liner 202 by the blocking layer 201 followed by ligand exchange reaction by an aluminium-containing gas (e.g., $Al(CH_3)_3$, $(CH_3)_2Al(OC_3H_7)$, or $(CH_3)_2AlCl$), a boron containing gas (e.g., $BCl_3$, $BH_3$, or $B_2H_6$), a titanium-containing gas ($TiCl_4$, TEMATi, TDMAT), or a silicon-containing gas (e.g., $SiCl_4$ or $Si_2H_3$).

According to one embodiment, shown by the process arrow 110, steps 102-108 may be repeated at least once to increase a thickness of the material film 203 that is selectively formed on the dielectric film 204.

Figure 3A:
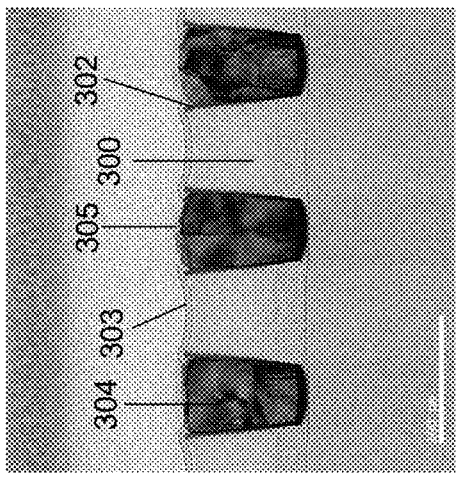
FIGS. 3A-3B show experimental results for selectively forming a film on a substrate according to an embodiment of the invention.
Figure 3B:
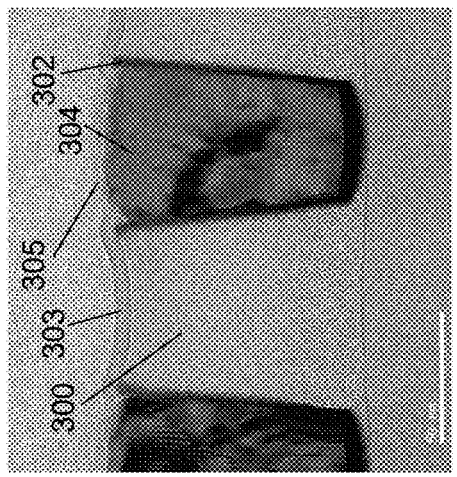

FIGS. 3A-5B shows experimental results for selectively forming a film on a substrate according to an embodiment of the invention. FIGS. 3A and 3B show cross-sectional SEM images, at different magnifications, of a substrate that contains a metal film 304 (i.e., Cu), a metal-containing liner 302 (i.e., TaN/Ta) surrounding the metal film 304, and a dielectric film 300 (i.e., a low-k) surrounding the metal-containing liner 302. A SAM (not discernable) containing a thiol was selectively formed on the metal film 304. Further, an $Al_2O_3$ film 303 was deposited on the dielectric film 300 and the metal-containing liner 302. The $Al_2O_3$ film 603 was deposited by vapor phase deposition using alternating exposures of an aluminum precursor and an oxidizer. The alternating exposures also deposited a small amount of $Al_2O_3$ film nuclei 605 on the metal film 304.

Figure 4A:
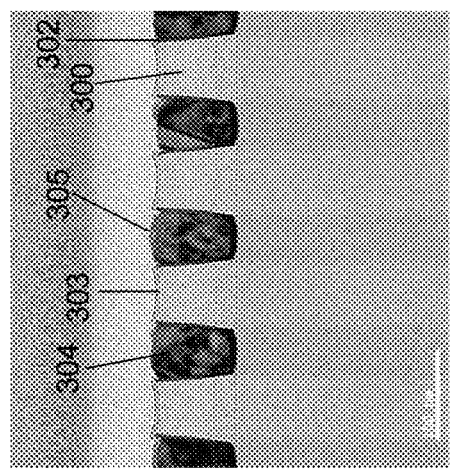
FIGS. 4A-4B show experimental results for selectively forming a film on a substrate according to an embodiment of the invention.
Figure 4B:
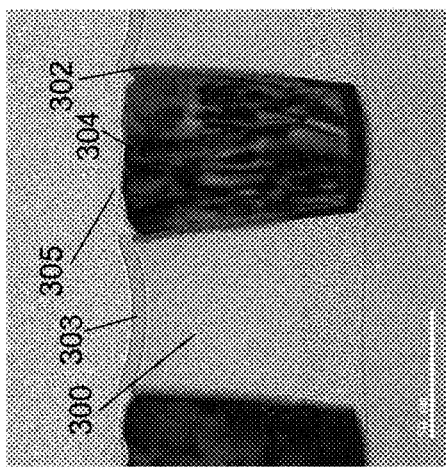

FIGS. 4A and 4B show cross-sectional SEM images, at different magnifications, of the substrate following a first etching process using an $Al(CH_3)_3$ gas exposure that partially removed the $Al_2O_3$ film 303 from the metal-containing liner 302 and the $Al_2O_3$ film nuclei 605 from the metal film 304.

Figure 5A:
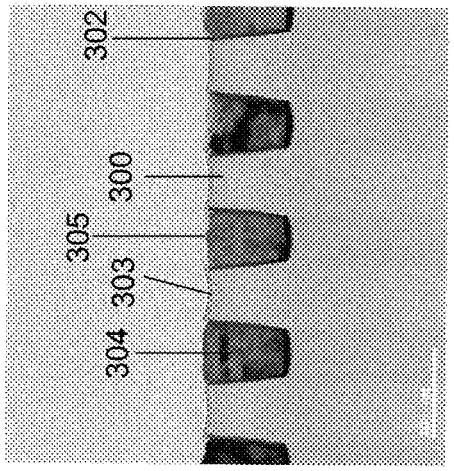
FIGS. 5A-5B show experimental results for selectively forming a film on a substrate according to an embodiment of the invention.
Figure 5B:
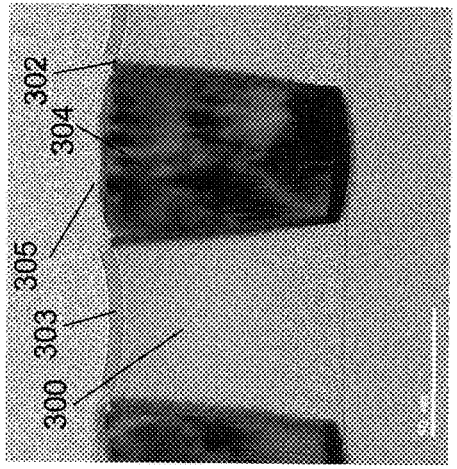

FIGS. 5A and 5B show cross-sectional SEM images, at different magnifications, of the substrate following a second etching process using an $Al(CH_3)_3$ gas exposure that fully removed the $Al_2O_3$ film 303 from the metal-containing liner 302 and the $Al_2O_3$ film nuclei 605 from the metal film 304. The second etching process included a longer gas exposure than the first etching process. The experimental results in FIGS. 3A-5B further show that the thickness of the Al$_2$O$_3$ film 305 on the dielectric film 300 was only slightly reduced by the etching processes.

Figures 6A, 6B:
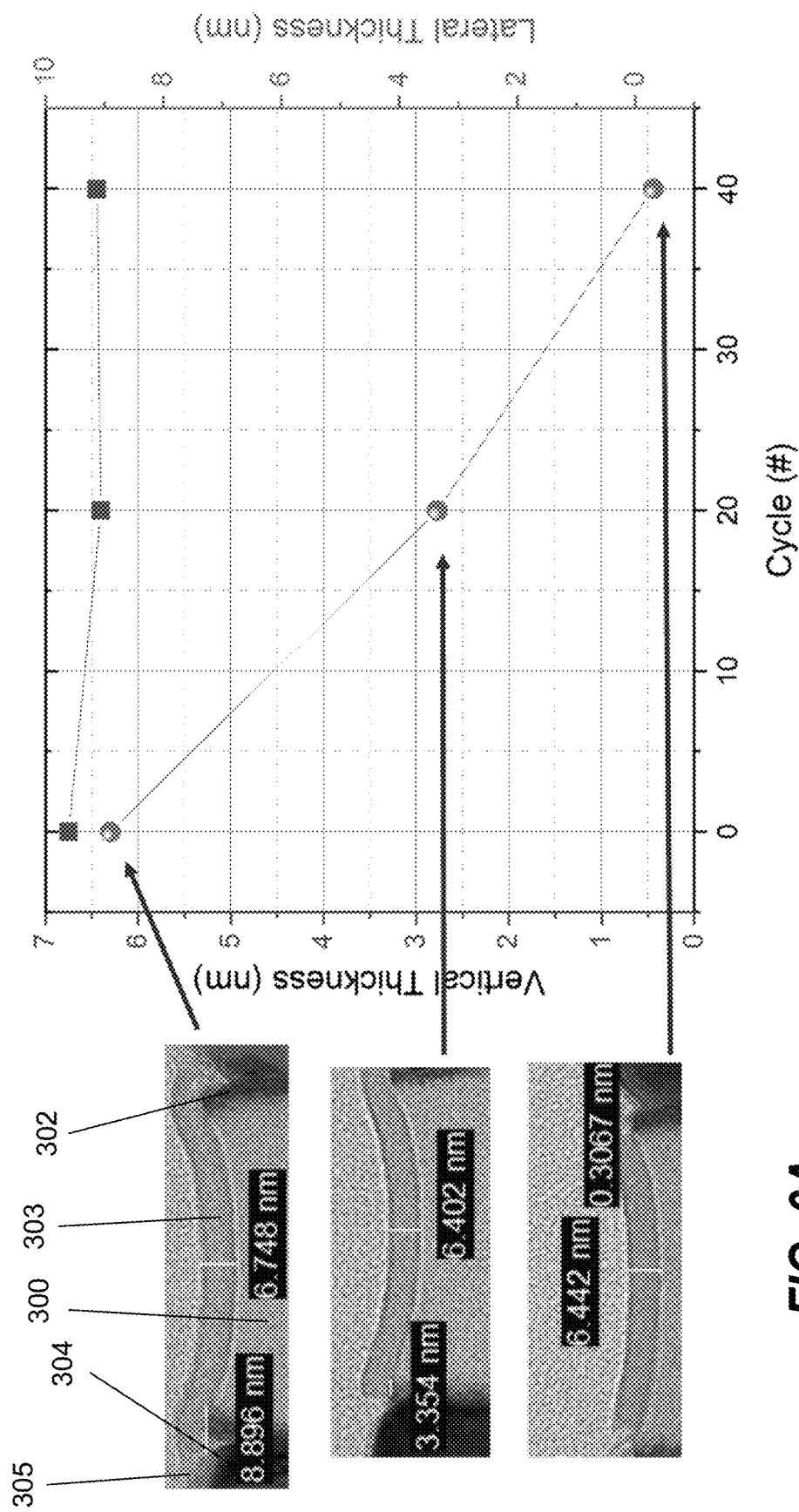
FIGS. 6A and 6B shows experimental results for selectively forming a film on a substrate according to an embodiment of the invention.

FIGS. 6A-6B shows experimental results for selectively forming a film on a substrate according to an embodiment of the invention. Portions of the SEM images in FIGS. 3A-5B are reproduced in FIG. 6A. FIG. 6B shows vertical thickness of the Al$_2$O$_3$ film 303 (square symbols and left axis) and lateral thickness of the Al$_2$O$_3$ film nuclei 305 (circles and right axis). The lateral thickness refers to the horizontal thickness of Al$_2$O$_3$ film nuclei 305 on the metal-containing liner 302. The results show that the vertical thickness of the Al$_2$O$_3$ film 303 on the dielectric film 304 was only slightly reduced by the etching processes but the lateral thickness of the Al$_2$O$_3$ film 303 was reduced from about 9 nm to about 3 nm by the first etching process, and further reduced from about 3 m to about 0 nm by the second etching process. The results clearly show that the resulting Al$_2$O$_3$ film 303 is only formed on the dielectric film 300, and not on the metal film 304 and the metal-containing liner 302.

Methods for selective film deposition that reduces lateral film formation by using a blocking layer and an etching process have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
   providing a substrate containing a metal film, a metal-containing liner surrounding the metal film, and a dielectric film surrounding the metal-containing liner;
   forming a blocking layer on the metal film;
   depositing a material film on the dielectric film and on the metal-containing liner; and
   removing the material film from the metal-containing liner to selectively form the material film on the dielectric film, wherein the removing laterally etches the material film from the metal-containing liner towards the dielectric film.

2. The method of claim 1, wherein the depositing also deposits material film nuclei on the metal film, and the removing etches the material film nuclei from the metal film.

3. The method of claim 1, wherein the metal-containing liner contains a metal compound that includes TiN, TaN or a metal that includes Co or Ru.

4. The method of claim 1, wherein the metal-containing liner contains a laminate of TaN/Ta, TaN/Co, or TaN/Ir.

5. The method of claim 1, wherein the metal film includes Cu, Al, Ta, Ti, W, Ru, Co, Ni, or Mo.

6. The method of claim 1, wherein the dielectric film includes SiO$_2$, a low-k material, or a high-k material.

7. The method of claim 1, wherein the material film includes SiO$_2$, a metal oxide, or a metal nitride.

8. The method of claim 5, wherein the metal oxide contains HfO$_2$, ZrO$_2$, or Al$_2$O$_3$.

9. The method of claim 1, wherein the blocking layer contains a self-assembled monolayer (SAM).

10. The method of claim 9, wherein the SAM includes a thiol.

11. The method of claim 10, wherein the thiol includes an alkane thiol or a fluoroalkane thiol.

12. The method of claim 11, wherein the alkane thiol includes dodecanethiol and the fluoroalkane thiol includes perfluorodecanethiol.

13. The method of claim 9, wherein the blocking layer includes a phosphonate and or a carboxylate.

14. A substrate processing method, comprising:
   providing a substrate containing a metal film, a metal-containing liner surrounding the metal film, and a dielectric film surrounding the metal-containing liner, wherein the metal film includes Cu, Ru, or Co;
   forming a blocking layer on the metal film, wherein the blocking layer includes a self-assembled monolayer that contains a thiol;
   depositing a material film on the dielectric film and on the metal-containing liner; and
   removing the material film from the metal-containing liner to selectively form the material film on the dielectric film, wherein the removing laterally etches the material film from the metal-containing liner towards the dielectric film.

15. The method of claim 14, wherein the depositing also deposits material film nuclei on the metal film, and the removing etches the material film nuclei from the metal film.

16. The method of claim 14, wherein the metal-containing liner contains a metal compound that includes TiN or TaN or a metal that includes Co or Ru.

17. The method of claim 14, wherein the metal-containing liner contains a laminate of TaN/Ta, TaN/Co, or TaN/Ir.

18. The method of claim 14, wherein the dielectric film includes SiO$_2$, a low-k material, or a high-k material.

19. The method of claim 14, wherein the material film includes SiO$_2$, a metal oxide, or a metal nitride.

20. A substrate processing method, comprising:
   providing a substrate containing a metal film, a metal-containing liner surrounding the metal film, and a dielectric film surrounding the metal-containing liner, wherein the metal film includes Cu, Ru, or Co, wherein the metal-containing liner contains a metal compound that includes TiN, TaN, a metal that includes Co or Ru, or a laminate of TaN/Ta, TaN/Co, or TaN/Ir;
   forming a blocking layer on the metal film, wherein the blocking layer includes a self-assembled monolayer that contains a thiol;
   depositing a material film on the dielectric film and on the metal-containing liner, wherein the material film includes SiO$_2$, a metal oxide, or a metal nitride, and wherein the depositing also deposits material film nuclei on the metal film; and
   removing the material film from the metal-containing liner and the material film nuclei from the metal film to selectively form the material film on the dielectric film, wherein the removing laterally etches the material film from the metal-containing liner towards the dielectric film.

* * * * *